United States Patent
Lee (10) Patent No.: US 11,615,917 B2
(45) Date of Patent: Mar. 28, 2023

(54) METHOD OF MANUFACTURING A FERRITE SHEET

(71) Applicant: AMOTECH CO., LTD., Incheon (KR)

(72) Inventor: Woong Yong Lee, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 0 days.

(21) Appl. No.: 17/256,112

(22) PCT Filed: Jun. 25, 2019

(86) PCT No.: PCT/KR2019/007629
§ 371 (c)(1),
(2) Date: Dec. 24, 2020

(87) PCT Pub. No.: WO2020/004890
PCT Pub. Date: Jan. 2, 2020

(65) Prior Publication Data
US 2021/0225585 A1    Jul. 22, 2021

(30) Foreign Application Priority Data

Jun. 26, 2018 (KR) .................. 10-2018-0073258
Jun. 24, 2019 (KR) .................. 10-2019-0074811

(51) Int. Cl.
| | |
|---|---|
| *H01F 7/06* | (2006.01) |
| *H01F 41/02* | (2006.01) |
| *H01F 1/34* | (2006.01) |
| *H01F 27/36* | (2006.01) |
| *H02J 50/10* | (2016.01) |

(52) U.S. Cl.
CPC .............. *H01F 41/02* (2013.01); *H01F 1/344* (2013.01); *H01F 27/366* (2020.08); *H02J 50/10* (2016.02)

(58) Field of Classification Search
CPC ........ H02J 50/10; H01F 27/366; H01F 1/344; H01F 41/02; H01F 38/14; H05K 9/00
See application file for complete search history.

(56) References Cited

FOREIGN PATENT DOCUMENTS

| | | | |
|---|---|---|---|
| CN | 104300194 A | | 1/2015 |
| CN | 106182374 | | 12/2016 |
| CN | 107005073 A | | 8/2017 |
| JP | 04373112 A | * | 12/1992 |
| JP | H07201565 A | * | 8/1995 |
| JP | 08096319 | | 4/1996 |
| KR | 20010092371 | | 10/2001 |
| KR | 20120140183 | | 12/2012 |
| KR | 20140081558 | | 7/2014 |
| KR | 20170057164 | | 5/2017 |

OTHER PUBLICATIONS

International Search Report—PCT/KR2019/007629 dated Oct. 17, 2019.
CN Office Action dated Nov. 23, 2021 re: Application No. 201980039038.0, pp. 1-10, citing: CN1315754A, KR20140081558A, CN1315754A, KR20140081558A, CN104300194A and CN107005073A.
Chinese Office Action—Chinese Application No. 201980039038.0 dated Jun. 16, 2022, citing CN 106182374 and KR 2014-0081558.

* cited by examiner

*Primary Examiner* — Paul D Kim
(74) *Attorney, Agent, or Firm* — Cantor Colburn LLP (57) ABSTRACT

A method for manufacturing a ferrite sheet is provided. A method for manufacturing a ferrite sheet comprises the steps of: preparing a ferrite block body having a shape of a cylindrical or polygonal column; and cutting the ferrite block body to be separated into plate-shaped sheets having a predetermined thickness.

8 Claims, 5 Drawing Sheets

METHOD OF MANUFACTURING A FERRITE SHEET

TECHNICAL FIELD

The present invention relates to a method for manufacturing a ferrite sheet, a ferrite sheet manufactured by the method, and a wireless power transfer module including the ferrite sheet.

BACKGROUND ART

Lately, electronic products provide many functions, are reduced in size, and are increased in speed to improve portability, convenience, and the like. Such a trend makes the configuration of an electronic circuit more complicated, and a high-frequency signal is used to process a large amount of data.

Accordingly, electronic products generate electromagnetic waves, and the electromagnetic waves generated by the electronic products cause surrounding electronic parts to malfunction and cause damage thereto. Therefore, an electromagnetic wave shielding material is used to prevent an electronic product from malfunctioning due to electromagnetic waves generated by the electronic product and external electromagnetic waves.

Meanwhile, portable electronic devices, such as a cellular phone, a tablet personal computer (PC), a laptop computer, a navigation device, and a smart watch, tend to basically have a wireless charging function. Accordingly, a wireless power transfer module for wirelessly charging a battery is installed in the portable electronic devices.

Also, with an increasing concern about environmental pollution, recently, use of electric vehicles is rapidly increasing. However, the capacity of a battery which provides the driving power of an electric vehicle is limited, and the electric vehicle has difficulty in traveling over a long distance. Accordingly, in order to overcome the limits of electric vehicles and increase battery efficiency, attempts are being made to ultimately develop an electric vehicle charging system in which a battery can be charged while traveling.

Wireless power transfer systems which are used in various fields as described above include a coil for wirelessly transmitting or receiving externally supplied power and a shielding sheet for shielding a magnetic field generated by the coil.

As the electromagnetic wave shielding material and the shielding sheet, a ferrite sheet is frequently used. Such a ferrite sheet is manufactured by mixing ferrite powder with a binder and the like to form a sheet and then sintering the sheet.

However, ferrite intrinsically has high brittleness, and thus it is difficult to process ferrite into a complex shape. For example, when it is necessary to form an arrangement hole for accommodating the thickness of a coil or a coupling hole for coupling with another part in the ferrite sheet, there is problem that the ferrite sheet may be broken or damaged by an external force applied during the work process.

In addition, ferrite sheets not only intrinsically have high brittleness but also require sintering process in the manufacturing process. Therefore, in a case in which a ferrite sheet is manufactured to have a large area of 200 mm×200 mm or more, the sheet may be distorted or deformed in the sintering process, which causes a difficulty in manufacturing a ferrite sheet having a large area.

Consequently, according to the conventional art, there is a limit to manufacturing a ferrite sheet having a large area of 200 mm×200 mm or more by attaching small-sized ferrite blocks together.

DISCLOSURE

Technical Problem

The present invention is directed to providing a ferrite sheet manufacturing method capable of simply manufacturing a ferrite sheet even when the ferrite sheet includes a complex shape.

The present invention is also directed to providing a ferrite sheet manufacturing method capable of manufacturing a plate-shaped ferrite sheet without distortion even when the ferrite sheet has a large area with a size of 200 mm or more in at least one of an overall width, an overall length, and diameter.

Technical Solution

One aspect of the present invention provides a method of manufacturing a ferrite sheet, the method including preparing a ferrite block body having a cylindrical or polygonal column shape and cutting the ferrite block body to be separated into plate-shaped sheets having a predetermined thickness.

The preparing of the ferrite block body may include shaping a ferrite powder or ferrite slurry into the ferrite block body having a cylindrical or polygonal column shape and sintering the ferrite block body.

The ferrite block body may include at least one through-hole portion which is formed to pass through the ferrite block body in a height direction, and the at least one through-hole portion may be formed in the ferrite block body before the ferrite block body is sintered. Accordingly, a ferrite sheet according to one embodiment of the present invention does not require post-processing even though a complex shape, such as the through-hole portion, is included, and thus the ferrite sheet may be simply manufactured.

The cutting of the ferrite block body may be performed by any one of wire cutting, sawing, waterjet cutting, and laser cutting.

The method may further include flaking the plate-shaped sheet to be separated into a plurality of flakes. In this way, it is possible to improve the flexibility of ferrite sheets.

At least one of upper and lower surfaces of the plate-shaped sheet may be formed as a cut surface.

The ferrite block body may be formed of Ni—Zn ferrite or Mn—Zn ferrite.

The plate-shaped sheets may have an overall thickness of 150 μm to 3 mm.

At least one of an overall width, an overall length, and a diameter of the plate-shaped sheet may be 200 mm or more. In this way, the ferrite sheets may be implemented to have a large area.

Another aspect of the present invention provides a ferrite sheet comprising a plate-shaped sheet formed of a ferrite material and separated into a plurality of flakes and one pair of protection films attached to the upper and lower surfaces of the plate-shaped sheet through bonding layers, wherein each of the plurality of flakes includes upper and lower surfaces formed as cut surfaces.

The above-described ferrite sheet may be implemented as a wireless power transfer module and applied to a cellular phone and the like.

Advantageous Effects

According to the present invention, even when a ferrite sheet includes a complex shape, the ferrite sheet can be easily manufactured. Consequently, it is possible to increase productivity and reduce manufacturing cost.

Also, according to the present invention, even when a ferrite sheet is implemented to have a large area, that is, any one of the overall width, the overall length, and the diameter of the ferrite sheet is 200 mm or more, the ferrite sheet can be manufactured without distortion so that the reliability of a product can be improved.

MODES OF THE INVENTION

Hereinafter, embodiments of the present invention will be described in detail with reference to the accompanying drawings so that those of ordinary skill in the art may easily practice the present invention. The present invention may be implemented in various different forms and is not limited to embodiments described herein. Portions unrelated to the description will be omitted in order to clearly describe the present invention. Throughout the specification, like numerals refer to like elements.

Even when ferrite sheets are finally implemented as plate-shaped sheets including a complex shape, a method of manufacturing a ferrite sheet according to one embodiment of the present invention makes it possible to simply manufacture the ferrite sheets having various thicknesses while including the complex shape without distortion or deformation.

In other words, a ferrite sheet 100 or 100' produced by the method of manufacturing a ferrite sheet according to one embodiment of the present invention may be implemented as a plate-shaped sheet having a predetermined area and may not have a simple quadrangular or circular plate shape but may have a complicated shape including at least one through-hole portion 12 which is formed to pass through the internal region and/or an edge along the thickness direction. In addition, the ferrite sheet 100 or 100' may have various thicknesses.

For example, the ferrite sheet 100 or 100' may be a thin plate sheet having an overall thickness of 150 μm to 3 mm, and the thin plate sheet may include at least one through-hole portion 12 which is formed to pass through the internal region and/or an edge.

Also, the ferrite sheet 100 or 100' may have a large area of which at least one of the overall width, the overall length, and the diameter is 200 mm or more. As a non-limiting example, the ferrite sheet 100 or 100' may have each of the overall width and the overall length of 200 mm or more and may be implemented to have a large area of 400 mm×400 mm.

However, the ferrite sheet 100 or 100' is not limited to the size and may have various sizes according to design conditions when having a size of 200 mm×200 mm or more or a diameter of 200 mm or more.

In other words, even when a ferrite sheet is implemented as a thin plate sheet including a complex shape or a sheet having a large area of which at least one side or the diameter has a length of 200 mm or more, the method of manufacturing a ferrite sheet according to one embodiment of the present invention makes it possible to easily produce the ferrite sheet through a simple process so that production costs may be reduced.

To this end, in the method of manufacturing a ferrite sheet according to one embodiment of the present invention, a ferrite block body 10 having a predetermined volume may be manufactured, and then the ferrite block body 10 may be sliced into plate-shaped sheets 20 having a constant thickness through a cutting process.

Accordingly, the plate-shaped sheets 20 may be implemented as plate-shaped ferrite sheets 100 or 100' having a predetermined area and thickness.

Figure 1:
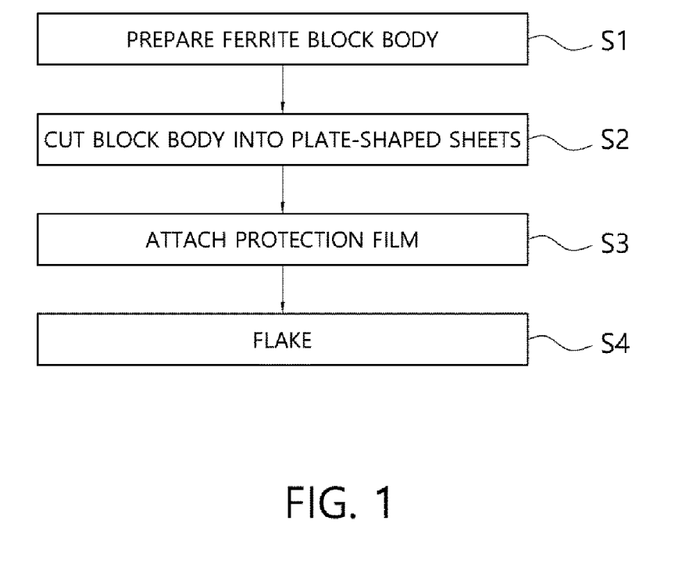
FIG. 1 is a block diagram illustrating a method of manufacturing a ferrite sheet according to one embodiment of the present invention.

Specifically, as shown in FIG. 1, the method of manufacturing a ferrite sheet according to one embodiment of the present invention includes a step S1 of preparing a ferrite block body and a step S2 of cutting the ferrite block body.

Figure 2A:
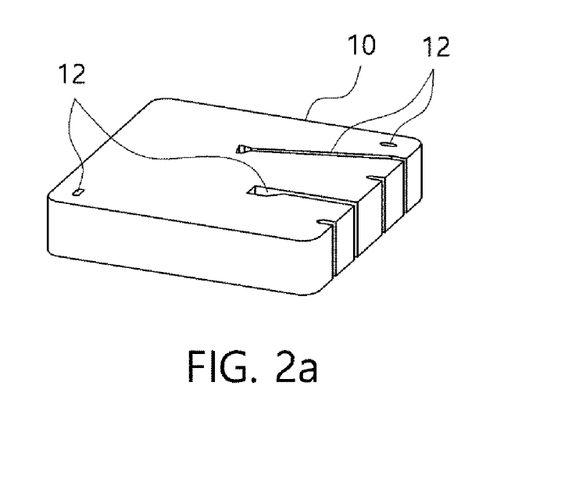
FIGS. 2a to 2d show a process sequence of the method of manufacturing a ferrite sheet according to one embodiment of the present invention.

As shown in FIG. 2a, the step S1 of preparing a ferrite block body may be a step of shaping ferrite powder into the bulk-shaped ferrite block body 10, of which at least one of the size, thickness, and volume is greater than that of the ferrite sheets 100 or 100' which are final products, and sintering the bulk-shaped ferrite block body 10.

In other words, the step S1 of preparing a ferrite block body may include a step of forming the bulk-shaped ferrite block body 10 and a step of sintering the bulk-shaped ferrite block body 10 by heating the bulk-shaped ferrite block body 10.

The step of forming the bulk-shaped ferrite block body may be a step of manufacturing the bulk-shaped ferrite block body 10 having a predetermined volume by compacting ferrite powder or tape-casting or extruding a ferrite powder slurry.

In the present invention, the ferrite powder may be Ni—Zn or Mn—Zn. However, the ferrite powder is not limited thereto, and all the well-known ferrite materials can be used as the ferrite powder. Also, the ferrite block body 10 may have the same cross-sectional shape as the ferrite sheets 100 or 100' which are final products and may have a much greater thickness or height than the ferrite sheets 100 or 100'.

In other words, the ferrite block body 10 may have a cylindrical or polygonal column shape but is not limited thereto. The overall shape of the ferrite block body 10 may appropriately vary with the shape of the ferrite sheets 100 or 100' which are final products.

As a non-limiting example, in a case in which the ferrite sheets 100 or 100' which are final products are formed as discs, the ferrite block body 10 may have a cylindrical shape, and in a case in which the ferrite sheets 100 or 100' are formed as quadrangular plates, the ferrite block body 10 may have a quadrangular column shape.

Also, in a case in which the ferrite sheets 100 or 100' which are final products include a coupling hole 112 for coupling with another part or an arrangement hole 114 for accommodating the thickness of a coil, the ferrite block body 10 may include the at least one through-hole portion 12 for forming the coupling hole 112 or the arrangement hole 114.

In other words, the at least one through-hole portion 12 may be formed to pass through the ferrite block body 10 along the height direction of the ferrite block body 10 at a position corresponding to the coupling hole 112 or the arrangement hole 114 of the ferrite sheets 100 or 100' which are final products. However, the role of the at least one through-hole portion 12 is not limited to the coupling hole 112 or the arrangement hole 114, and the at least one through-hole portion 12 may serve as an opening portion for improving performance of the ferrite sheets 100 or 100'.

The through-hole portion 12 may be formed before the bulk-shaped ferrite block body 10 is sintered.

For example, the through-hole portion 12 may be formed in the step of shaping the ferrite powder or ferrite slurry into the bulk-shaped ferrite block body 10 or may be formed by shaping the ferrite powder or ferrite slurry into the bulk-shaped ferrite block body 10 and then additionally processing the ferrite block body 10 before sintering.

Accordingly, even when the ferrite sheets 100 or 100' which are final products include a complex shape, such as the coupling hole 112 and/or the arrangement hole 114, the method of manufacturing a ferrite sheet according to one embodiment of the present invention makes it possible to easily form the above-described complex shape using the through-hole portion 12 formed in the ferrite block body 10 before sintering.

Also, in the method of manufacturing a ferrite sheet according to one embodiment of the present invention, since the sintering step is performed in a state in which the ferrite block body 10 is formed to have a greater volume and thickness than the ferrite sheets 100 or 100' which are final products it is possible to maintain high quality.

In other words, even when the ferrite block body 10 is distorted or shrunk in the sintering process, the ferrite sheets 100 or 100' which are final products may be implemented as plate-shaped sheets by processing the ferrite block body 10 of which distortion or shrinkage has been finished in the sintering process.

Accordingly, even when the ferrite sheets 100 or 100' are implemented as thin plate sheets or large-area sheets, the ferrite sheets 100 or 100' may not be distorted, and the upper and lower surfaces may be formed as level surfaces.

For this reason, the method of manufacturing a ferrite sheet according to one embodiment of the present invention makes it possible to produce the high-quality ferrite sheets 100 or 100' at all times regardless of deformation, such as distortion or shrinkage, which may occur in the sintering step.

The step S2 of cutting the ferrite block body may be an operation of separating the sintered ferrite block body 10 into the plate-shaped sheets 20 having a predetermined thickness through processing.

Figure 2B:
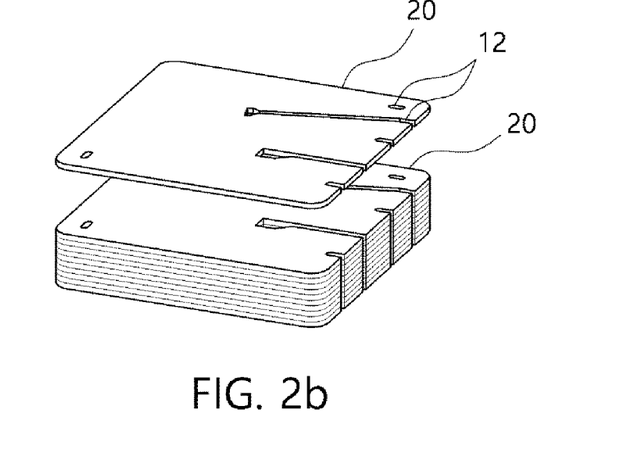

As shown in FIG. 2b, the plate-shaped sheets 20 separated from the ferrite block body 10 may have a similar thickness to that of the ferrite sheets 100 or 100' which are final products, and the plurality of plate-shaped sheets 20 may be separated from the single ferrite block body 10.

Accordingly, as for the ferrite sheets 100 or 100' manufactured by the method of manufacturing a ferrite sheet according to one embodiment of the present invention, at least one of the upper and lower surfaces of each of the plate-shaped sheets 20 constituting the ferrite sheets 100 or 100' may be a cut surface formed by a cutting process. Preferably, both the upper and lower surfaces of the plate-shaped sheets 20 may be cut surfaces.

As described above, the method of manufacturing a ferrite sheet according to one embodiment of the present invention makes it possible to produce the plurality of ferrite sheets 100 or 100' using the plurality of plate-shaped sheets 20 separated from the single bulk-shaped ferrite block body 10.

Since the method of manufacturing a ferrite sheet according to one embodiment of the present invention makes it possible to produce the plurality of ferrite sheets 100 or 100' from the single ferrite block body 10, work productivity can be increased.

In other words, the method of manufacturing a ferrite sheet according to one embodiment of the present invention may lead to an increase in productivity and facilitates manufacturing not only when the ferrite sheets 100 or 100' which are final products are formed as small-area sheets having an overall width, an overall length, and a diameter of 200 mm or less but also when the ferrite sheets 100 or 100' which are final products are formed as large-area sheets of which at least one of an overall width, an overall length, and a diameter is 200 mm or more.

In addition, even when the ferrite sheets 100 or 100' which are final products include a complex shape, such as the coupling hole 112 and/or the arrangement hole 114, the method of manufacturing a ferrite sheet according to one embodiment of the present invention may allow the through-hole portion 12 formed in the ferrite block body 10 to become the coupling hole 112 or the arrangement hole 114 of the plate-shaped sheets 20 through a cutting process.

Accordingly, the ferrite sheets 100 or 100' manufactured by the method of manufacturing a ferrite sheet according to one embodiment of the present invention do not require additional work for processing the coupling hole 112 or the arrangement hole 114 in the plate-shaped sheets 20. Therefore, productivity can be increased, and it is possible to prevent difficulty in processing the plate-shaped sheets 20 which have been sintered or damage to the plate-shaped sheets 20.

In other words, since the ferrite sheets 100 or 100' manufactured by the method of manufacturing a ferrite sheet according to one embodiment of the present invention are implemented as plate-shaped sheets having a predetermined thickness by cutting the ferrite block body 10, the plate-shaped sheets may have a thin-plate thickness of, for example, 150 μm to 3 mm even when including a complex shape such as the coupling hole 112 or the arrangement hole 114.

In the step S2 of cutting the ferrite block body 10 according to the present invention, a cutting direction of the ferrite block body 10 may be a horizontal direction perpendicular to the height direction of the ferrite block body 10. However, the cutting direction is not limited thereto and may be various directions which form a predetermined angle with respect to the height direction of the ferrite block body 10.

In addition, the cutting process for cutting the ferrite block body may be performed by any one of wire cutting, sawing, waterjet cutting, and laser cutting. However, the cutting process is not limited thereto, and all the well-known physical methods can be used without limitation as long as the ferrite block body can be cut into plate-shaped sheets.

Figure 2C:
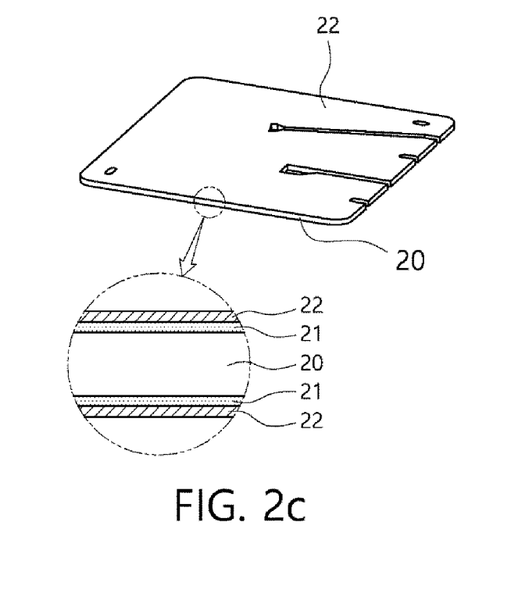

Meanwhile, the method of manufacturing a ferrite sheet according to one embodiment of the present invention may include a step S3 of attaching a protection film 22 as shown in FIG. 2c.

The protection film 22 may be attached to at least one of the both surfaces of a plate-shaped sheet 20 separated from the ferrite block body 10 through a bonding layer 21. Preferably the protection film 22 may be attached to each of the upper and lower surfaces through the bonding layer 21.

Figure 4:
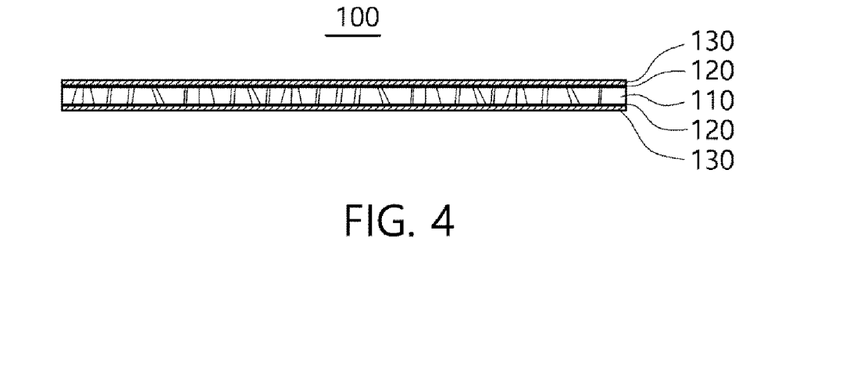
FIG. 4 is a cross-sectional view taken along line A-A in FIG. 3.

In this way, each of the ferrite sheets 100 or 100' manufactured by the method of manufacturing a ferrite sheet according to one embodiment of the present invention may be implemented to include a plate-shaped sheet 110 separated from the ferrite block body 10 and one pair of protection films 130 attached to the upper and lower surfaces of the plate-shaped sheet 110 through bonding layers 120 as shown in FIG. 4. Here, at least one of the pair of protection films 130 may be a release film which is removed when the ferrite sheet 100 or 100' is used.

Meanwhile, the method of manufacturing a ferrite sheet according to one embodiment of the present invention may further include a flaking step S4.

Figure 2D:
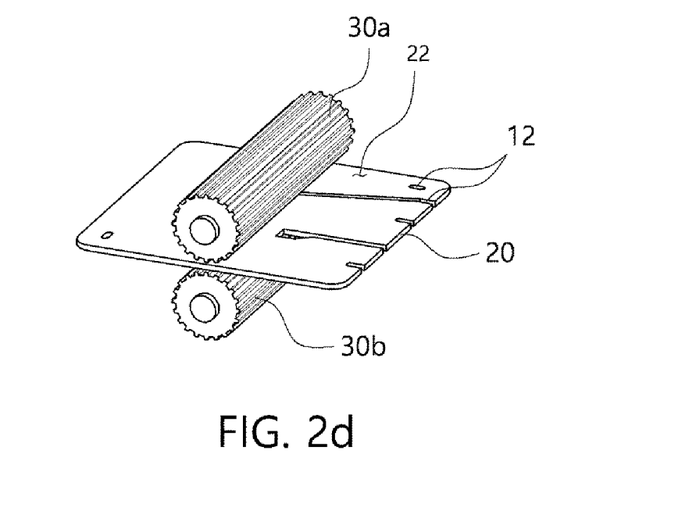

As shown in FIG. 2d, the flaking step S4 may improve flexibility of a plate-shaped sheet 20 separated from the ferrite block body 10 by separating the plate-shaped sheet 20 into a plurality of flakes.

In other words, the plate-shaped sheet 20 separated from the ferrite block body 10 may be passed through one pair of press rollers 30a and 30b in a state in which the one pair of protection films 22 are attached to the upper and lower surfaces thereof through the bonding layers 21 as shown in FIGS. 2c and 2d.

Accordingly, the plate-shaped sheet 20 may be separated into a plurality of flakes due to external force during the process of passing through the one pair of press rollers 30a and 30b, and the bonding layers 21 and the protection films 22 may prevent external deviation of the separated flakes. Such a flaking process can employ not only rollers but also various methods such as pressurization with a mold.

In this way, although the ferrite sheet 100 manufactured by the method of manufacturing a ferrite sheet according to one embodiment of the present invention is formed of a ferrite material which has high brittleness, the flexibility can be improved through the flaking process, and thus it is possible to minimize damage caused by external force.

Also, even when external force is additionally exerted, it is possible to maintain a magnetic characteristic at a level equivalent to a design value because the ferrite sheet 100 manufactured by the method of manufacturing a ferrite sheet according to one embodiment of the present invention is separated into a plurality of flakes in advance through the flaking process.

In particular, even when the ferrite sheets 100 manufactured by the method of manufacturing a ferrite sheet according to one embodiment of the present invention are implemented as thin plates or to have a large area, the ferrite sheets 100 can have flexibility through the flaking process. Therefore, it is possible to reduce the possibility of being damaged by external force, and even when additional damage is caused by external forces, it is possible to maintain a characteristic at a level equivalent to a design value.

In the ferrite sheets 100 manufactured through the flaking step S4 according to the present invention, parts or the whole of the bonding layers 120 disposed on the both surfaces of the plate-shaped sheets 110 may permeate between neighboring flakes.

Figure 3:
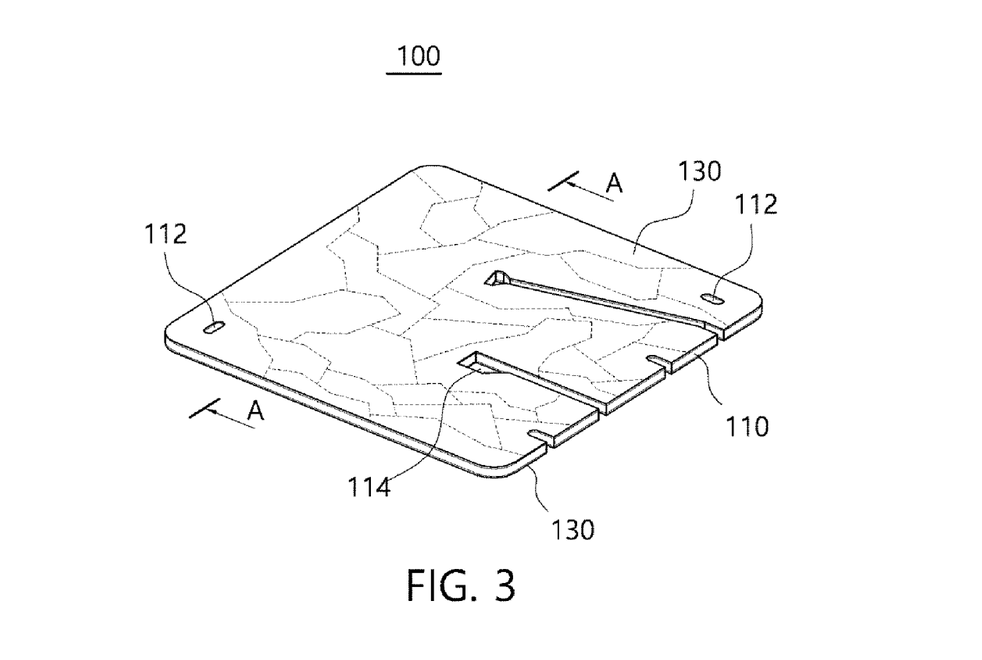
FIG. 3 shows a ferrite sheet manufactured by the method of manufacturing a ferrite sheet according to one embodiment of the present invention.
Figure 5:
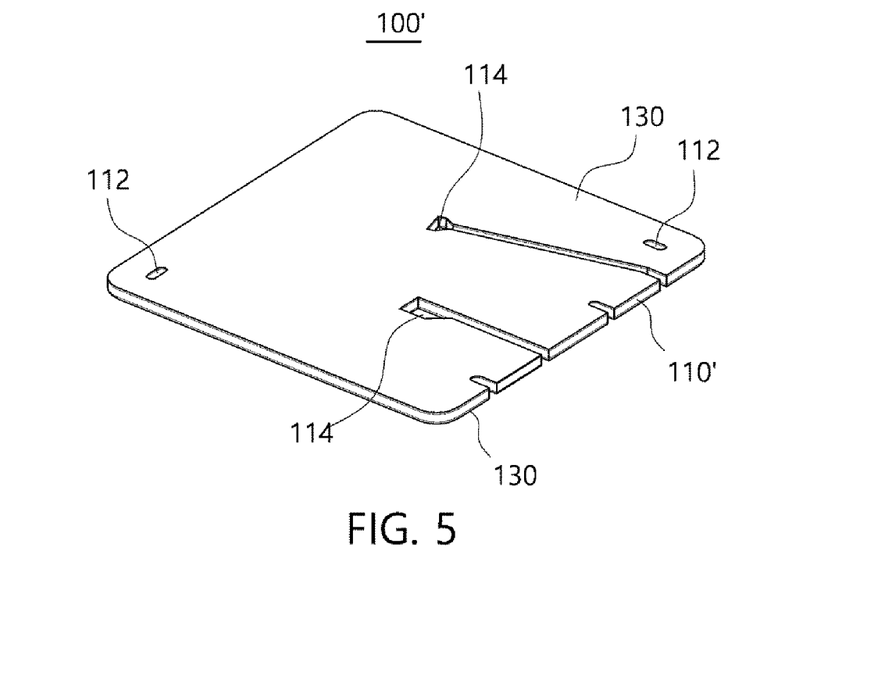
FIG. 5 shows another type of a ferrite sheet manufactured by the method of manufacturing a ferrite sheet according to one embodiment of the present invention.

The ferrite sheets 100 or 100' manufactured by the above-described method of manufacturing a ferrite sheet according to one embodiment of the present invention may have a form of FIGS. 3 to 5.

For example, the ferrite sheet 100 or 100' may include the plate-shaped sheet 110 or 110' formed of a ferrite material and the one pair of protection films 130 attached to the upper and lower surfaces of the plate-shaped sheet 110 or 110' through the bonding layers 120.

As described above, the plate-shaped sheets 110 or 110' may be the plate-shaped sheets 20 cut off from the ferrite block body 10. Also, both the upper and lower surfaces of the plate-shaped sheets 110 or 110' may be cut surfaces, and the plate-shaped sheets 110 or 110' may include the coupling hole 112 in which a coupling member is inserted for coupling with another part and/or the arrangement hole 114 for accommodating the thickness of a flat coil.

As described above, the coupling hole 112 or the arrangement hole 114 formed in the plate-shaped sheets 110 or 110' may be formed through the at least one through-hole portion 12 formed in the ferrite block body 10.

Also, the plate-shaped sheets 110 or 110' may be separated into a plurality of flakes through the flaking process as shown in FIGS. 3 and 4 or may not be separated into a plurality of flakes as shown in FIG. 5 by omitting the flaking process.

Meanwhile, the ferrite sheets 100 or 100' manufactured by the above-described method of manufacturing a ferrite sheet according to one embodiment of the present invention may be applied to all fields in which well-known ferrite sheets are employed in the same way.

In other words, the ferrite sheets 100 or 100' may be used as an electromagnetic wave shielding material, and the ferrite sheets 100 or 100' may be used to prevent an electronic product from malfunctioning due to electromagnetic waves generated by the electronic product and external electromagnetic waves.

In addition, the ferrite sheets 100 or 100' may be used to enhance performance of high-frequency electronic circuits, which are greatly affected by external interference, or various antennas used in radio frequency identification (RFID) or near-field communication (NFC) communication, wireless power transfer, and the like.

As a non-limiting example, the ferrite sheet 100 or 100' may be applied to a wireless power transfer module 200 for wireless power transfer of a portable device.

For example, the wireless power transfer module 200 may include one or more wireless power transfer antennas 211 and 212 for receiving or transmitting power using a magnetic field of a predetermined frequency band and a shielding sheet for shielding from the magnetic field generated by the wireless power transfer antennas 211 and 212.

In this embodiment, the above-described ferrite sheet 100 or 100' may be used as the shielding sheet without change.

The wireless power transfer module 200 may be implemented as a wireless power transmitting module in a case in which the wireless power transfer antennas 211 and 212 externally transmit wireless power or may be implemented as a wireless power receiving module in a case in which the wireless power transfer antennas 211 and 212 receive wireless power.

Figure 6:
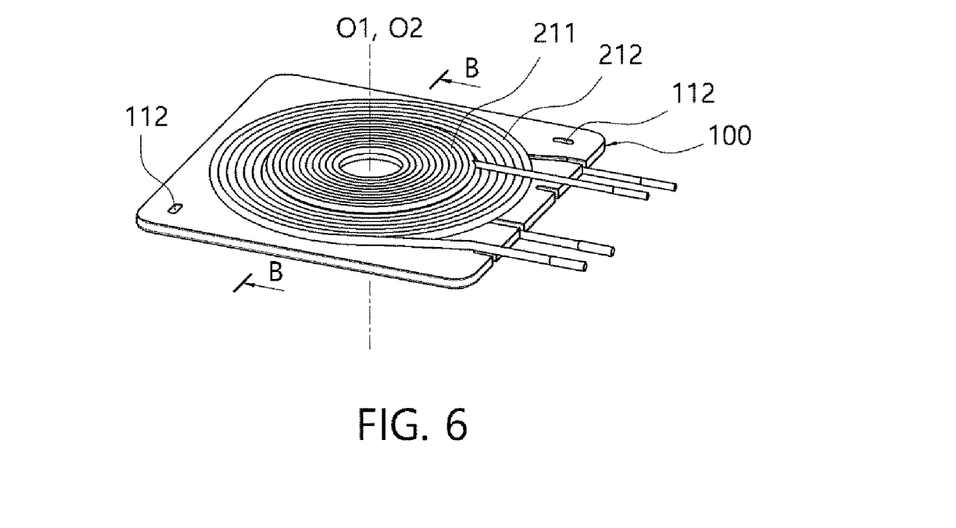
FIG. 6 shows a wireless power transfer module including a ferrite sheet manufactured by the method of manufacturing a ferrite sheet according to one embodiment of the present invention.
Figure 7:
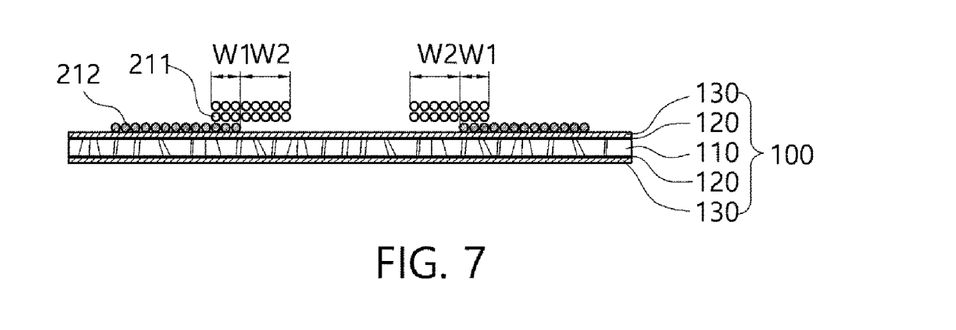
FIG. 7 is a cross-sectional view taken along line B-B in FIG. 6.

As a specific example, as shown in FIGS. 6 and 7, the wireless power transfer module 200 may be implemented as a wireless power transmitting module for transmitting wireless power to different types of electronic devices having different sizes.

Here, any one of the different types of electronic devices may be an electronic device of which a battery is charged in a wireless manner using a Qi standard A11 coil.

For example, the different types of electronic devices may be a first electronic device of which a battery is wirelessly charged using a coil having a smaller size than the Qi standard A11 coil and a second electronic device of which a battery is wirelessly charged using the Qi standard A11 coil.

In other words, the first electronic device may be a wearable device, such as a smart watch, of which a battery is wirelessly charged using a coil having a smaller size than the Qi standard A11 coil, and the second electronic device may be a mobile electronic device, such as a smart phone, of which a battery is wirelessly charged using the Qi standard A11 coil.

To this end, in the wireless power transfer module 200 according to one embodiment of the present invention, a first wireless power transfer antenna 211 for transmitting wireless power to the first electronic device and a second wireless power transfer antenna 212 for transmitting wireless power to the second electronic device may be disposed on one side of the ferrite sheet 100 or 100'.

Accordingly, the first wireless power transfer antenna 211 and the second wireless power transfer antenna 212 may transmit wireless power using a predetermined frequency band when a power is supplied.

The first wireless power transfer antenna 211 and the second wireless power transfer antenna 212 may be configured with flat coils which conductive member having a predetermined length is wound clockwise or counterclockwise a plurality of times to form hollow portion including center points O1 and O2.

In other words, the first wireless power transfer antenna 211 and the second wireless power transfer antenna 212 may include plate-shaped coil bodies obtained by winding the conductive members and the hollow portions formed at the central portion of the coil bodies.

Meanwhile, the coil bodies of the first wireless power transfer antenna 211 and the second wireless power transfer antenna 212 may have different sizes. The first wireless power transfer antenna 211 may have a smaller size than the second wireless power transfer antenna 212.

In this case, the first wireless power transfer antenna 211 may be disposed so that one portion of the coil body of the first wireless power transfer antenna 211 corresponding to a first width W1 may overlap the coil body of the second wireless power transfer antenna 212 and the other portion of the coil body corresponding to a second width W1 rather than the portion corresponding to the first width W1 may be located in the central portion formed in the coil body of the second wireless power transfer antenna 212.

Also, as shown in FIG. 7, the portion of the coil body of the first wireless power transfer antenna 211 corresponding to the second width W2 may not be accommodated in the central portion formed in the coil body of the second wireless power transfer antenna 212 and may be disposed apart from one surface of the ferrite sheet 100 or 100'.

In addition, the first wireless power transfer antenna 211 and the second wireless power transfer antenna 212 may be disposed so that the center points O1 and O2 of the coil bodies may match with each other, and the first wireless power transfer antenna 211 and the second wireless power transfer antenna 212 may selectively operate through a circuit unit.

In this way, in the wireless power transfer module 200 according to one embodiment of the present invention, the second wireless power transfer antenna 212 of the two wireless power transfer antennas 211 and 212 for charging the batteries of different types of electronic devices may conform to standards of the Qi standard A11 coil, and the first wireless power transfer antenna 211 having a smaller size than the Qi standard A11 coil may be disposed to overlap only a part of the whole width of the second wireless power transfer antenna 212 so that selective wireless charging may be smoothly performed using the first wireless power transfer antenna 211 and the second wireless power transfer antenna 212. Accordingly, it is possible to solve the authentication problem of the Qi standard A11 coil and also charge different types of electronic devices.

Also, in the wireless power transfer module 200 according to one embodiment of the present invention, even when the central portion of the second wireless power transfer antenna 212 configured with the Qi standard A11 coil is smaller than the first wireless power transfer antenna 211, it is possible to sufficiently extend the entire length of a conducive member constituting the first wireless power transfer antenna 211 so that the inductance required for wirelessly charging the first electronic device can be satisfied.

In addition, in the wireless power transfer module 200 according to one embodiment of the present invention, the first wireless power transfer antenna 211 and the second wireless power transfer antenna 212 may be disposed so that the center points O1 and O2 thereof match with each other. Therefore, even when the different types of first and second electronic devices are placed at the same location, wireless charging may be smoothly performed. Accordingly, when a user wants to charge the battery of an electronic device, the electronic devices can be placed at the same location regardless of the types and sizes thereof so that the convenience of use can be improved.

Meanwhile, the above-described ferrite sheet 100 or 100' may also be applied to a wireless power transfer module for charging the battery of an electric vehicle, and it is to be noted that the ferrite sheet 100 or 100' can be applied to any product or use, such as home appliances or household items, for shielding a magnetic field.

The method of manufacturing a ferrite sheet according to one embodiment of the present invention has been described as a method for manufacturing ferrite sheets from a ferrite block body obtained by shaping ferrite powder or a ferrite slurry. However, the method is not limited thereto and can be applied to a method for manufacturing ceramic sheets from a ceramic block body obtained by shaping ceramic powder or a ceramic slurry in the same way.

In other words, the method of manufacturing a ferrite sheet according to one embodiment of the present invention may be used as a method of shaping ceramic powder or a ceramic slurry instead of the above-described ferrite powder or ferrite slurry into a bulk-shaped ceramic block body and then producing a plurality of ceramic sheets from the ceramic block body through a cutting process.

In addition, the method of manufacturing a ferrite sheet according to one embodiment of the present invention may be applied to manufacturing of a shielding sheet for an electric vehicle which requires a large-area shielding sheet. As described above, it is difficult to implement a large-area shielding sheet formed of a ferrite material due to warpage, distortion, etc. caused in a sintering process, and thus it is necessary to manufacture a large shielding sheet formed of a ferrite material by a method of joining small ferrite blocks together or the like.

However, according to the embodiment, there is no worry of distortion or warpage during a sintering process, and thus it is possible to form a large-area shielding sheet formed of a ferrite material with various thicknesses and in various sizes.

Although one embodiment of the present invention has been described above, the spirit of the present invention is not limited to one embodiment set forth herein. Those of ordinary skill in the art who understand the spirit of the present invention may easily propose other embodiments within the same spirit by appending, changing, omitting, and adding elements, but one embodiment also fall within the scope of the present invention.

The invention claimed is:

1. A method of manufacturing a ferrite sheet, the method comprising:
    preparing a ferrite block body having a cylindrical shape or a polygonal column shape and including at least one through-hole portion passing through the ferrite block body in a height direction;
    sintering the ferrite block body to form a sintered ferrite block body; and
    cutting the sintered ferrite block body in a direction perpendicular to the height direction to form a plate shaped sheet having a predetermined thickness and at least one through-hole portion,
    wherein the at least one through-hole portion, which is formed in the sintered ferrite block body, is formed in the step of shaping a ferrite powder or a ferrite slurry into a bulk-shaped ferrite block body before the bulk-shaped ferrite block body is sintered, and
    wherein the at least one through-hole portion, which is formed in the sintered ferrite block body, includes a through-hole portion formed to extend inwardly from an edge of the sintered ferrite block body to serve as an arrangement hole in the plate shaped sheet.

2. The method of claim 1, wherein the cutting of the sintered ferrite block body is performed by any one of a wire cutting, a sawing, a waterjet cutting, and a laser cutting.

3. The method of claim 1, further comprising: attaching a protection film to an upper surface and a lower surface of the plate-shaped sheet through a bonding layer.

4. The method of claim 1, further comprising: flaking the plate-shaped sheet to be separated into a plurality of flakes.

5. The method of claim 1, wherein at least one of an upper surface and a lower surface of the plate-shaped sheet is formed as a cut surface.

6. The method of claim 1, wherein the ferrite powder or the ferrite slurry is formed of a Ni—Zn ferrite or a Mn—Zn ferrite.

7. The method of claim 1, wherein the predetermined thickness is in a range of 150 µm to 3 mm.

8. The method of claim 1, wherein at least one of a width, a length, and a diameter of the plate-shaped sheet is 200 mm or more.

* * * * *